(12) United States Patent
Yun et al.

(10) Patent No.: US 12,162,114 B2
(45) Date of Patent: Dec. 10, 2024

(54) POLISHING PAD, MANUFACTURING METHOD THEREOF AND PREPARING METHOD OF SEMICONDUCTOR DEVICE USING THE SAME

(71) Applicant: SK enpulse Co., Ltd., Gyeonggi-do (KR)

(72) Inventors: Jong Wook Yun, Seoul (KR); Jae In Ahn, Gyeonggi-do (KR); Eun Sun Joeng, Gyeonggi-do (KR); Hye Young Heo, Gyeonggi-do (KR); Jang Won Seo, Seoul (KR)

(73) Assignee: SK ENPULSE CO., LTD., Gyeonggi-do (KR)

( * ) Notice: Subject to any disclaimer, the term of this patent is extended or adjusted under 35 U.S.C. 154(b) by 428 days.

(21) Appl. No.: 17/488,859

(22) Filed: Sep. 29, 2021

(65) Prior Publication Data
US 2022/0097201 A1 Mar. 31, 2022

(30) Foreign Application Priority Data

Sep. 29, 2020 (KR) .................. 10-2020-0126794
Sep. 29, 2020 (KR) .................. 10-2020-0126799

(51) Int. Cl.
*B24B 29/00* (2006.01)
*C08J 9/32* (2006.01)
*H01L 21/306* (2006.01)

(52) U.S. Cl.
CPC .............. *B24B 29/00* (2013.01); *C08J 9/32* (2013.01); *H01L 21/30625* (2013.01);
(Continued)

(58) Field of Classification Search
CPC ......... B24B 29/00; C08J 9/32; C08J 2203/22; C08J 2205/044; C08J 2207/00; C08J 2375/04; H01L 21/30625
See application file for complete search history.

(56) References Cited

U.S. PATENT DOCUMENTS

2019/0314954 A1  10/2019  Heo et al.

FOREIGN PATENT DOCUMENTS

| JP | 2001-239455 A | 9/2001 |
| JP | 2007-081322 A | 3/2007 |

(Continued)

OTHER PUBLICATIONS

Search Report for the Singaporean Application No. 10202110735S issued by the Singaporean Patent Office on Aug. 3, 2022.
(Continued)

*Primary Examiner* — Pegah Parvini
(74) *Attorney, Agent, or Firm* — IP & T GROUP LLP

(57) ABSTRACT

The present disclosure relates to a polishing pad, a method of manufacturing the polishing pad, and a method of manufacturing a semiconductor device using the same. In the polishing pad, an unexpanded solid-phase blowing agent is included in a polishing composition when a polishing layer is manufactured, and the unexpanded solid-phase blowing agent is expanded during a curing process to form a plurality of uniform pores in the polishing layer, such that defects occurring on a surface of the semiconductor substrate may be prevented. In addition, the present disclosure may provide a method of manufacturing a semiconductor device to which the polishing pad is applied.

17 Claims, 6 Drawing Sheets

(52) U.S. Cl.
CPC ...... *C08J 2203/22* (2013.01); *C08J 2205/044* (2013.01); *C08J 2207/00* (2013.01); *C08J 2375/04* (2013.01)

(56) References Cited

FOREIGN PATENT DOCUMENTS

| | | | |
|---|---|---|---|
| JP | 2010274362 A | * | 12/2010 |
| JP | 2018-174010 A | | 11/2018 |
| JP | 2019-195901 A | | 11/2019 |
| KR | 10-2017-0108087 A | | 9/2017 |
| KR | 10-2019-0029473 A | | 3/2019 |
| KR | 10-2019-0135449 A | | 12/2019 |
| KR | 10-2088919 B1 | | 3/2020 |
| TW | 201943774 A | | 11/2019 |

OTHER PUBLICATIONS

Written Opinion for the Singaporean Application No. 10202110735S issued by the Singaporean Patent Office on Aug. 9, 2022.
Office Action issued by the Korean Intellectual Property Office on Jan. 26, 2022.
Office Action issued by the Korean Intellectual Property Office on Jan. 27, 2022.
Extended European Search Report issued by the European Patent Office on Feb. 23, 2022.
Office Action issued by the Taiwanese Patent Office on Apr. 6, 2022.
Office Action for the Chinese Patent Application No. 202111130346.X including Search Report issued by the Chinese Patent Office on Aug. 31, 2023.
Office Action for the Japanese Patent Application No. 2021-159778 issued by the Japanese Patent Office on Nov. 22, 2022.
Office Action for Korean Patent Application No. 10-2020-0126794 issued by the Korean Patent Office on Jul. 26, 2022.

* cited by examiner

[FIG. 1]
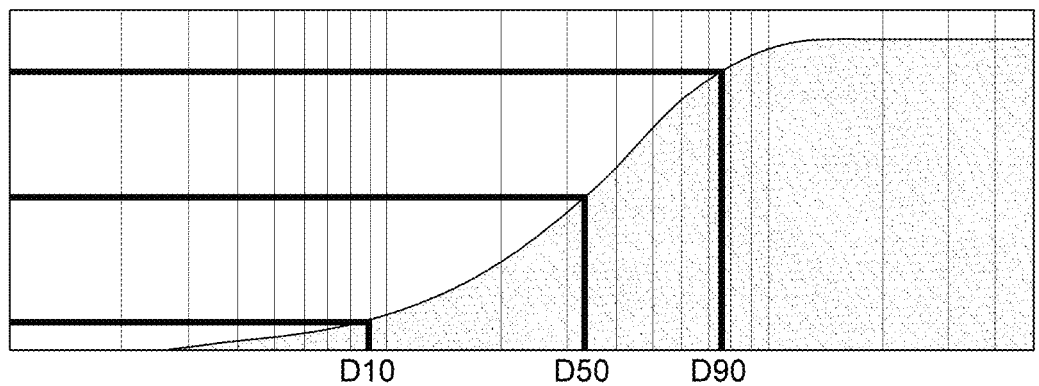
[FIG. 2]
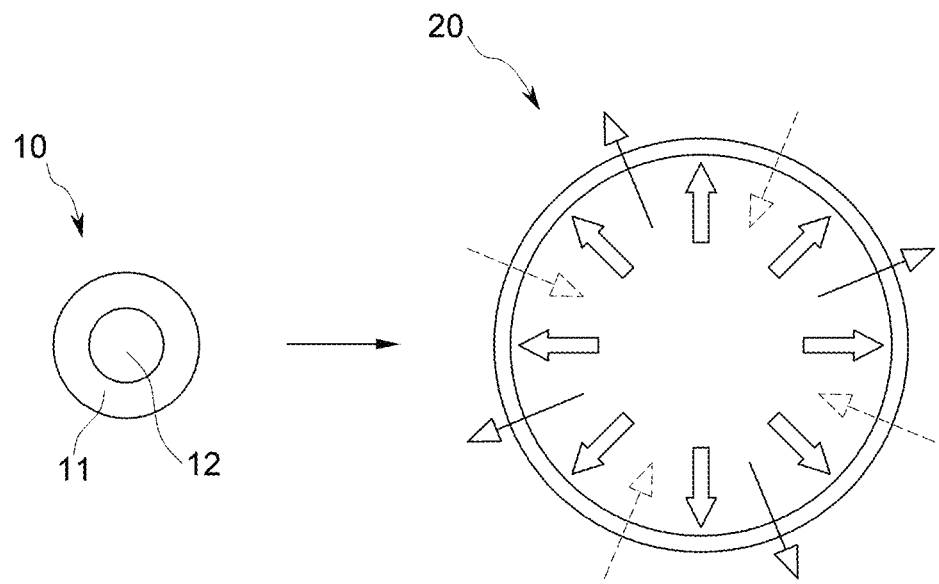

[FIG. 3]
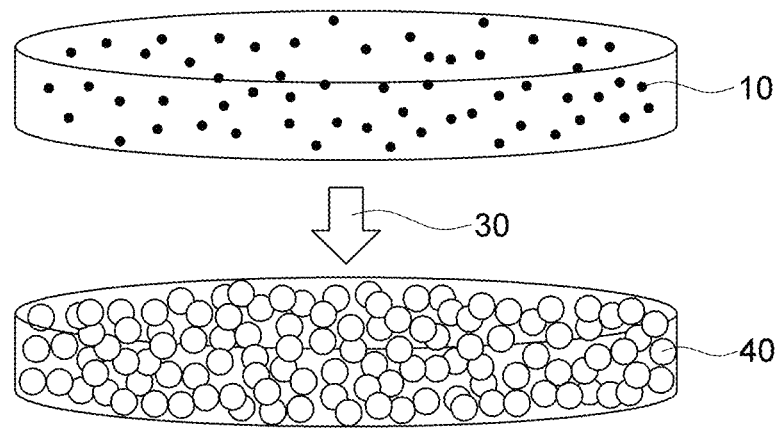
[FIG. 4]
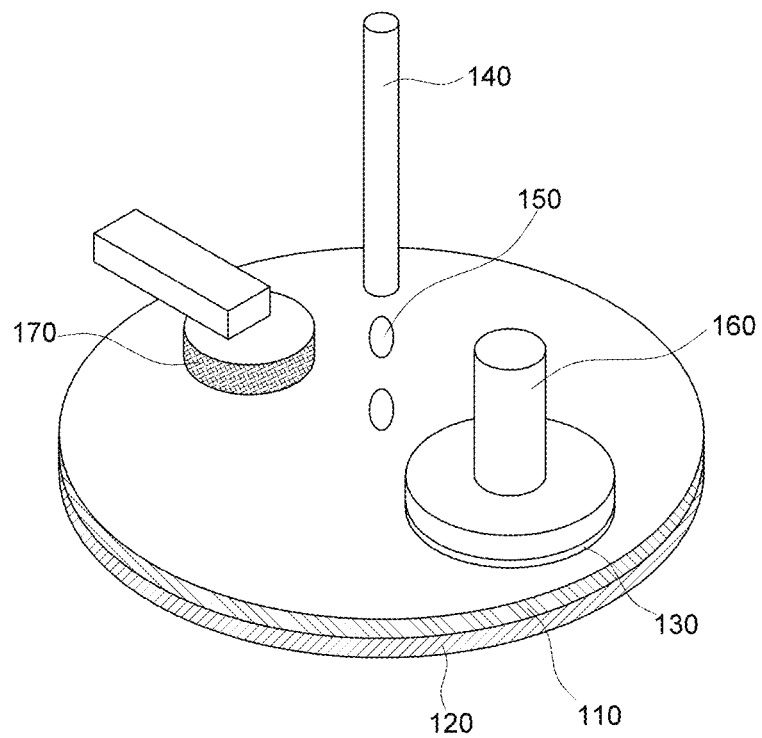

[FIG. 5]
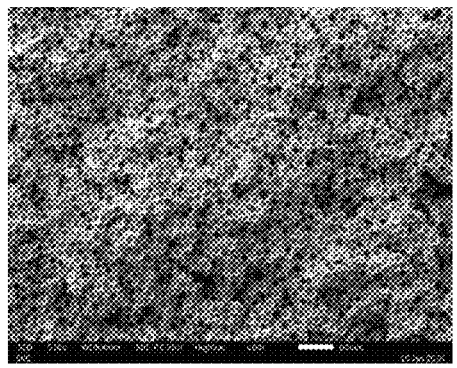
[FIG. 6]
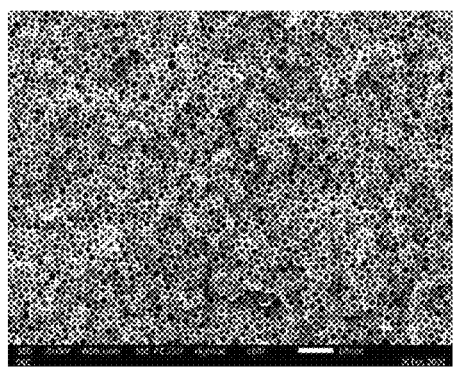
[FIG. 7]
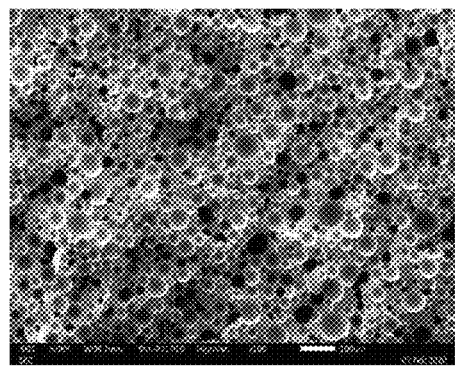

[FIG. 8]
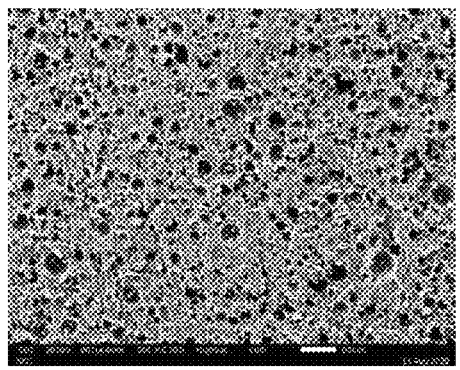
[FIG. 9]
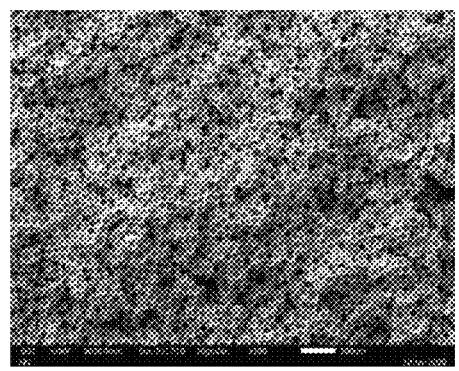
[FIG. 10]
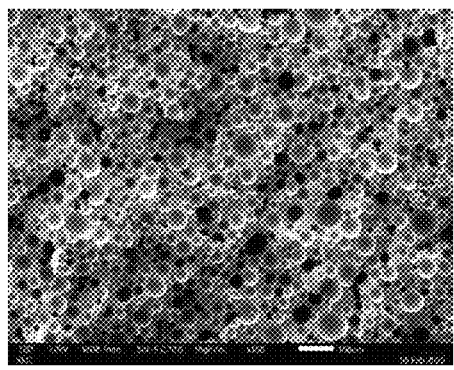

[FIG. 11]
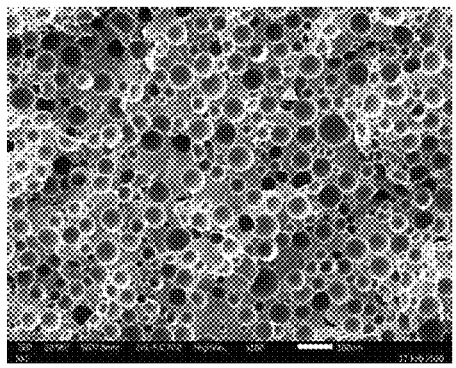
[FIG. 12]
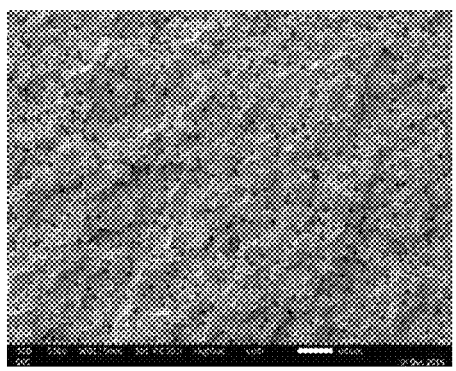
[FIG. 13]
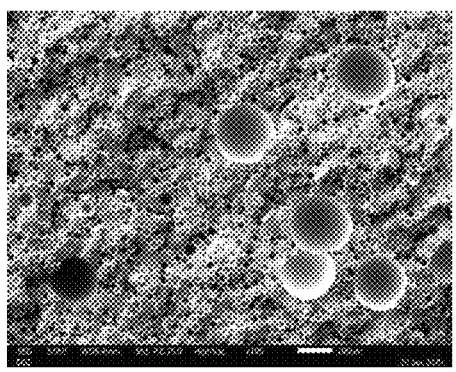

[FIG. 14]
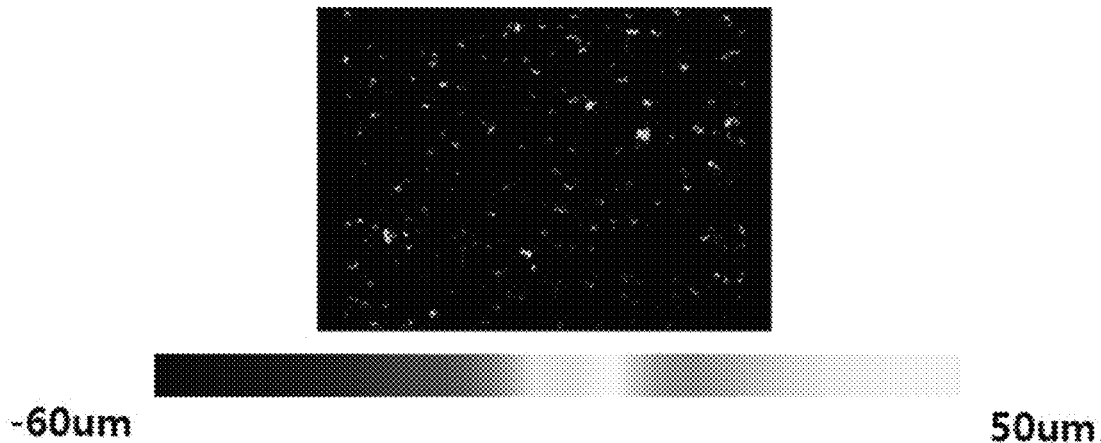
[FIG. 15]
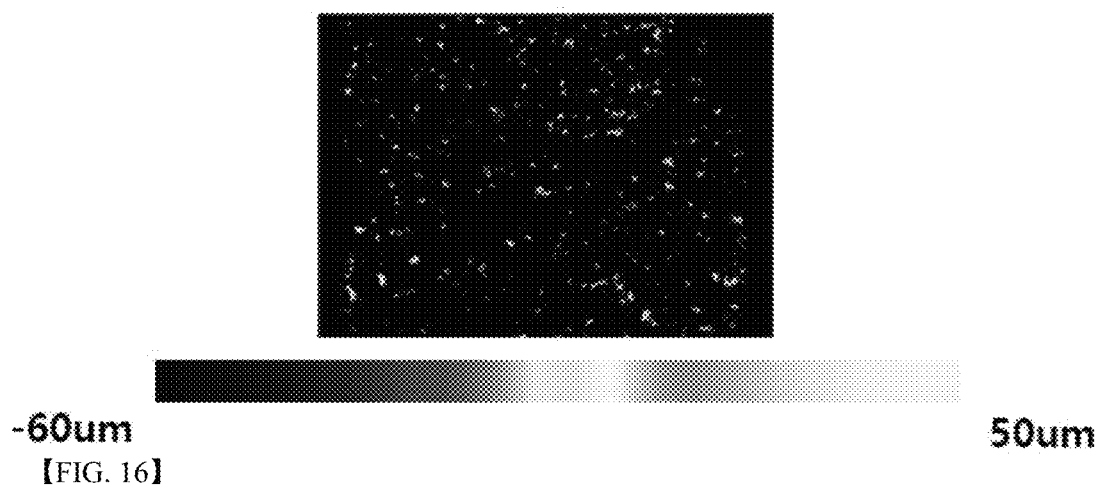
[FIG. 16]
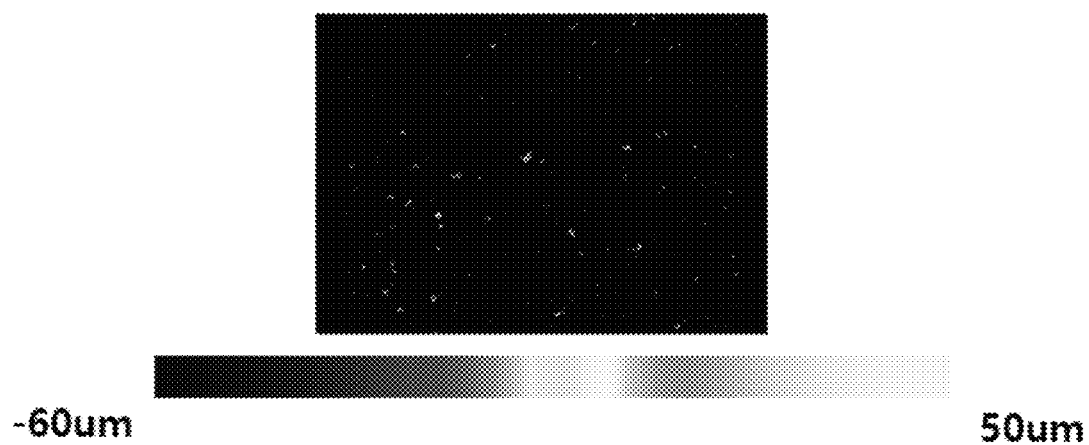

POLISHING PAD, MANUFACTURING METHOD THEREOF AND PREPARING METHOD OF SEMICONDUCTOR DEVICE USING THE SAME

CROSS-REFERENCE TO RELATED APPLICATION(S)

This application claims priority to Korean Patent Application No. 10-2020-0126794, filed on Sep. 29, 2020 and No. 10-2020-0126799, filed on Sep. 29, 2020, the disclosure of which is incorporated herein by reference in its entirety.

BACKGROUND OF THE INVENTION

Field of the Invention

The present disclosure relates to a polishing pad used in a chemical mechanical planarization (CMP) process, a method of manufacturing the same, and a method of manufacturing a semiconductor device using the same.

Description of the Related Art

Among semiconductor manufacturing processes, a chemical mechanical planarization (CMP) process is a process of mechanically planarizing an uneven portion of a surface of a wafer by relatively moving a platen and a head while generating a chemical reaction between a slurry and the surface of the wafer by supplying the slurry in a state where the wafer is attached to the head and comes into contact with a surface of a polishing pad formed on the platen.

"Dishing" refers to a phenomenon in which CMP polishing causes metal recesses in low areas such as oxide cavities or troughs where a metal layer should remain, but does not remain, parallel to or on the same plane as a lower layer of a substrate wafer after the CMP polishing.

As semiconductor wafers and devices become increasingly complex by fine feature portions and more metallization layers, the dishing problem has recently been recognized as an important problem. This trend requires more improved performance for consumables used in a polishing process in order to maintain flatness and limit polishing defects.

Such defects in wafers and devices may cause electrical insulation or short circuits in conductive lines that render the semiconductor device inoperable. A soft polishing pad may be used to reduce polishing defects such as micro-scratches or chatter marks, thereby reducing polishing defects.

In addition, CMP polishing of a soft metal layer will be able to reduce polishing defects through the use of a softer CMP polishing pad.

However, although CMP polishing using a soft pad may improve defects in the polished substrate, such a soft pad may increase dishing on a surface of a metallized semiconductor wafer due to flexible properties of the soft pad.

Accordingly, there is a need for development of a polishing pad capable of reducing dishing on a substrate surface that may occur due to a CMP polishing process for a metal surface within a semiconductor wafer or device substrate, minimizing polishing defects that may occur on a wafer, and exhibiting polishing performance suitable for a process.

SUMMARY OF THE INVENTION

An object of the present disclosure is to provide a polishing pad, a method of manufacturing the polishing pad, and a method of manufacturing a semiconductor device using the same.

Another object of the present disclosure is to provide a polishing pad capable of increasing an area of a polishing surface of a polishing layer in direct contact with a semiconductor substrate during a polishing process and preventing defects occurring on a surface of the semiconductor substrate, by forming pores of the polishing layer in the polishing pad in a uniform size and adjusting surface roughness properties of the polishing surface of the polishing layer.

Still another object of the present disclosure is to provide a method for manufacturing a polishing pad, wherein an unexpanded solid-phase blowing agent is included in a polishing composition when a polishing layer is manufactured, and the unexpanded solid-phase blowing agent is expanded during a curing process to form a plurality of uniform pores in the polishing layer.

Yet another object of the present disclosure is to provide a method of manufacturing a semiconductor device to which the polishing pad is applied.

Technical Solution

A polishing pad according to an embodiment of the present disclosure includes a polishing layer, wherein the polishing layer includes a plurality of pores, and the pores may have a value of 0.5 to 1 according to the following Equation 1 or 2:

$$\frac{D10}{D50} \quad [\text{Equation 1}]$$

$$\frac{D50}{D90} \quad [\text{Equation 2}]$$

Wherein
D10 is a diameter of pores in 10% cumulative volume distribution,
D50 is a diameter of pores in 50% cumulative volume distribution, and
D90 is a diameter of pores in 90% cumulative volume distribution.

A polishing pad according to another embodiment of the present disclosure includes a polishing layer, wherein the polishing layer includes a plurality of pores, and the pores may have a value of 0.5 to 1.5 according to the following Equation 3:

$$\frac{(D90 - D50)}{(D50 - D10)} \quad [\text{Equation 3}]$$

wherein
D10 is a diameter of pores in 10% cumulative volume distribution,
D50 is a diameter of pores in 50% cumulative volume distribution, and
D90 is a diameter of pores in 90% cumulative volume distribution.

A method of manufacturing a polishing pad according to another embodiment of the present disclosure may include: i) preparing a prepolymer composition; ii) preparing a composition for manufacturing a polishing layer, containing the prepolymer composition, a blowing agent and a curing agent; and iii) curing the composition for manufacturing a polishing layer to prepare a polishing layer.

A method of manufacturing a semiconductor device according to another embodiment of the present disclosure may include: 1) providing a polishing pad including a polishing layer; and 2) polishing the semiconductor substrate while rotating the semiconductor substrate and the polishing layer relative to each other so that a polished surface of the semiconductor substrate is in contact with the polishing surface of the polishing layer.

Advantageous Effects

In the polishing pad according to the present disclosure, an unexpanded solid-phase blowing agent is included in a polishing composition when a polishing layer is manufactured, and the unexpanded solid-phase blowing agent is expanded during a curing process to form a plurality of uniform pores in the polishing layer and adjust surface roughness properties of the polishing surface of the polishing layer, thereby making it possible to increase an area of the polishing surface of the polishing layer in direct contact with the semiconductor substrate during the polishing process and prevent defects occurring on the surface of the semiconductor substrate.

In addition, the present disclosure may provide a method of manufacturing a semiconductor device to which the polishing pad is applied.

BRIEF DESCRIPTION OF DRAWINGS

FIG. 1 is a graph of a cumulative volume diameter according to an embodiment of the present disclosure.

FIG. 2 is a conceptual diagram of a solid blowing agent included in the manufacture of a polishing layer according to an embodiment of the present disclosure.

FIG. 3 is a conceptual diagram of the blowing of the solid blowing agent in the manufacture of a polishing layer according to an embodiment of the present disclosure.

FIG. 4 is a schematic process diagram of a process of manufacturing a semiconductor device according to an embodiment of the present disclosure.

FIG. 5 is an SEM measurement result of the pores of the polishing layer according to an embodiment of the present disclosure.

FIG. 6 is an SEM measurement result of the pores of the polishing layer according to an embodiment of the present disclosure.

FIG. 7 is an SEM measurement result of the pores of the polishing layer according to an embodiment of the present disclosure.

FIG. 8 is an SEM measurement result of the pores of the polishing layer according to an embodiment of the present disclosure.

FIG. 9 is an SEM measurement result of the pores of the polishing layer according to an embodiment of the present disclosure.

FIG. 10 is an SEM measurement result of the pores of the polishing layer according to an embodiment of the present disclosure.

FIG. 11 is an SEM measurement result of the pores of the polishing layer according to an embodiment of the present disclosure.

FIG. 12 is an SEM measurement result of the pores of the polishing layer according to an embodiment of the present disclosure.

FIG. 13 is an SEM measurement result of the pores of the polishing layer according to an embodiment of the present disclosure.

FIG. 14 relates to a real contact area of a polishing surface of a polishing layer according to an embodiment of the present disclosure.

FIG. 15 relates to a real contact area of polishing surface of a polishing layer according to an embodiment of the present disclosure.

FIG. 16 relates to a real contact area of polishing surface of a polishing layer according to an embodiment of the present disclosure.

BEST MODE

Hereinafter, embodiments of the present disclosure will be described in detail so as to be easily carried out by those of ordinary skill in the art to which the present disclosure pertains. However, the present disclosure may be implemented in various different forms and is not limited to examples described herein.

It should be understood that numbers expressing amounts of components, properties such as molecular weight, reaction conditions, etc., used in the present disclosure are modified with the term "about" in all cases.

All percentages, parts, ratios, etc., are by weight, unless otherwise stated herein.

As used herein, "including" will be understood to imply the inclusion of other components rather than the exclusion of other components, unless explicitly described to the contrary.

As used herein, "a plurality" refers to more than one.

As used herein, "10% cumulative volume diameter", "50% cumulative volume diameter", and "90% cumulative volume diameter" are particle diameters (diameters) representing 10%, 50%, and 90% of a cumulative frequency distribution of a volume particle diameter, respectively. More specifically, as shown in FIG. 1, a Y-axis refers to volume (%) and an X-axis refers to a diameter (μm), and the cumulative frequency distribution of the pore volume with respect to the diameter of the pore is obtained by dividing the sum of the volumes of pores up to the corresponding diameter by the sum of the volumes of all pores as the diameter of the pore increases. That is, the 10% cumulative volume diameter refers to a corresponding diameter, that is, the largest diameter when the volume of pores having a gradually large diameter are cumulatively added from the pores having the smallest diameter and the cumulatively added volume is 10%. In addition, the 50% cumulative volume diameter refers to a corresponding diameter, that is, the largest diameter when the volume of pores having a gradually large diameter are cumulatively added from the pores having the smallest diameter and the cumulatively added volume is 50%. In addition, the 90% cumulative volume diameter refers to a corresponding diameter, that is, the largest diameter when the volume of pores having a gradually large diameter are cumulatively added from the pores having the smallest diameter and the cumulatively added volume is 90%.

A polishing pad according to an embodiment of the present disclosure includes a polishing layer, the polishing layer includes a plurality of pores, and the pores may have a value of 0.5 to 1 according to the following Equation 1 or 2:

$$\frac{D10}{D50} \quad \text{[Equation 1]}$$

$$\frac{D50}{D90} \quad \text{[Equation 2]}$$

wherein

D10 is a diameter of pores in 10% cumulative volume distribution,

D50 is a diameter of pores on 50% cumulative volume distribution, and

D90 is a diameter of pores on 90% cumulative volume distribution.

In a conventional manufacture of the polishing layer in the polishing pad, pores having an irregular size and arrangement were formed by a physical method or a chemical method. According to the conventional method of manufacturing the polishing layer, pores having various shapes and sizes are arranged in irregularly dispersed forms on the surface and inside of the polishing layer made of a polymer material.

Among conventional methods of forming pores or holes in the polishing layer, a physical method is to mix a micro-sized material with a material forming the polishing layer. In this case, the micro-sized materials having pores should be added to mix well with the polymer at the beginning of the manufacture of the polishing layer.

However, the physical method is difficult to allow the micro-sized materials to mix well initially with the polymer, and the size of the micro-sized material formed by the physical method is also not constant.

In general, an average pore diameter formed by the physical method is about 100 micrometers, and the diameter of each pore ranges from several tens of micrometers to several hundreds of micrometers. This is a phenomenon that occurs because of the limitations of the technology for making pores. In addition, when the polishing pad is manufactured, the distribution also varies for each position due to gravity, making it difficult to manufacture a polishing layer with uniform performance.

The polishing layer manufactured by the physical method has a problem in that the size or distribution of the formed pores is not constant, so that when the semiconductor substrate is polished with high precision, the efficiency varies depending on the area or time in contact with the polishing layer.

Alternatively, the chemical method utilizes a phenomenon in which pores may be formed on a CMP polishing pad, and when water, or a liquid that may easily change to a gaseous state is put together with a polymer solution and heated to a low temperature, the liquid turns into a gas and pores are formed.

However, this method of forming pores inside using a gas also has a problem in that it is difficult to keep the pore size constant.

The polishing pad is a consumable item used for polishing a surface of the semiconductor substrate, and is an indispensable and important component. The slurry is present between the polishing pad and the surface of a semiconductor substrate during the polishing process and chemically and mechanically polishes the surface of the semiconductor substrate, and the slurry used is discharged to the outside.

In order for the slurry to be present on the polishing pad for a period of time, the polishing pad should be able to store the slurry. Such a slurry storage function of the polishing pad may be performed by pores or grooves formed in the polishing pad.

That is, the slurry penetrates into the pores or grooves formed in the polishing pad to efficiently polish the surface of the semiconductor substrate for a long time. In order for the polishing pad to suppress the flow of slurry as much as possible and achieve good polishing efficiency, the shape of pores or grooves should be well controlled, and physical properties such as hardness of the polishing pad should be able to maintain optimum conditions.

Accordingly, the polishing pad according to the present disclosure may be controlled to have a certain size with respect to a plurality of pores formed in the polishing layer, thereby preventing defects occurring during the polishing process.

More specifically, the polishing layer has a plurality of pores, and the pores may have a value of 0.5 to 1 according to the following Equation 1 or 2:

$$\frac{D10}{D50} \quad \text{[Equation 1]}$$

$$\frac{D50}{D90} \quad \text{[Equation 2]}$$

wherein

D10 is a diameter of pores in 10% cumulative volume distribution,

D50 is a diameter of pores in 50% cumulative volume distribution, and

D90 is a diameter of pores in 90% cumulative volume distribution.

Equation 1 refers to a ratio of the 50% cumulative volume diameter to the 10% cumulative volume diameter of the pores, and Equation 2 refers to a ratio of the 90% cumulative volume diameter to the 50% cumulative volume diameter.

When the relative cumulative volume diameter is measured, D10 refers to a diameter value of pores corresponding to 10% volume, and the larger the value of the number following D, the larger the diameter of pores.

As described above, a value is calculated by Equations 1 and 2, and the value is 0.5 to 1, or preferably 0.52 to 0.85, which means that the pore distribution is formed in a uniform range.

Specifically, for the pores, when the cumulative volume diameter of D10 to D90 is measured, the standard deviation of the measured cumulative diameter value may be 2 to 9.

More specifically, the result of calculating the standard deviation of D10, D20, D30, D40, D50, D60, D70, D80 and D90 values, which are the cumulative volume diameter values of pores, may be 2 to 9, preferably 3 to 7.5. This will mean that, when the cumulative volume diameter is measured, the size of the diameter increases as the value of the cumulative volume increases, but the degree of increase in the diameter is not large, and will mean that the polishing layer of the present disclosure is formed with a plurality of pores of uniform size.

The ratio of the 50% cumulative volume diameter to the 10% cumulative volume diameter of the pores and the ratio of the 90% cumulative volume diameter to the 50% cumulative volume diameter of the pores is 0.5 to 1, preferably 0.52 to 0.85, and the size distribution of the formed pores is uniform, such that a polishing rate and a cut rate during the polishing process are not affected, and the occurrence of defects in the semiconductor substrate may be prevented.

The 50% cumulative volume diameter of the pores formed in the polishing layer is 10 μm to 70 μm, or 20 to 65 μm. In one embodiment, the 50% cumulative volume diameter of the pores formed in the polishing layer may be 10 μm to 25 μm, or 18 μm to 23 μm. As described above, the 50% cumulative volume diameter of the pores may be formed to be small. In another embodiment, the 50% cumulative volume diameter of the pores formed in the polishing layer may be 10 μm to 70 μm, or 20 μm to 65 μm. As will be described later, the plurality of pores formed in the polishing layer of the present disclosure are characterized in that the diameters are uniformly formed, and the pores may be formed within the range of the 50% cumulative volume diameter, thereby preventing the occurrence of defects in the polishing process.

More specifically, the polishing layer has a plurality of pores, and the pores may have a value of 0.5 to 1.5, preferably 0.5 to 1.1 according to the following Equation 3:

$$\frac{(D90 - D50)}{(D50 - D10)} \quad [\text{Equation 3}]$$

wherein

D10 is a diameter of pores in 10% cumulative volume distribution,

D50 is a diameter of pores in 50% cumulative volume distribution, and

D90 is a diameter of pores in 90% cumulative volume distribution.

Equation 3 refers to a relationship to the diameter of pores in the cumulative volume distribution, and the degree of uniformity of the plurality of pores formed in the polishing layer can be confirmed through the ratio of a size difference to the pores in the 90% cumulative volume distribution and a size difference to the pores in the 10% cumulative volume distribution, compared to the diameter of the pores in the 50% cumulative volume distribution.

If the value according to Equation 3 is within the scope of this invention, it means that the size of the pores in the cumulative volume distribution is uniform, and a plurality of pores formed in the polishing layer are formed in a uniform size distribution, thereby preventing the occurrence of defects in the semiconductor substrate when used in a polishing process.

In order to form uniform pores in the polishing layer of the present disclosure, a preheating temperature of a mold and the type of blowing agent play an important role when the composition for manufacturing the polishing layer is injected into the mold.

The composition containing a urethane-based prepolymer, a curing agent, and a blowing agent is injected into a preheated mold and cured, and the preheating temperature of the mold may be 50 to 150° C.

As will be described later, the blowing agent included for manufacturing the polishing layer of the present disclosure is unexpanded particles, and the blowing agent may be included in the composition for manufacturing the polishing layer, injected into the preheated mold, and then foamed during the curing process to form a plurality of pores.

Here, a difference may occur in the heat and pressure provided to the blowing agent by the preheated mold, and a difference may occur in the diameter of the pores generated by the degree of difference.

The preheating temperature of the mold may be 50 to 150° C., preferably 90 to 140° C., and more preferably 100 to 130° C. When the composition for manufacturing the polishing layer is injected into the preheated mold within the above range, the diameter of the pores formed in the polishing layer may be uniformly formed.

There is a difference in the diameter of D50 depending on the preheating temperature of the mold. Specifically, when the preheating temperature of the mold is 100° C., D50 may be 20 to 25 μm, preferably 21 to 22 μm, when the preheating temperature of the mold is 115° C., D50 may be 35 to 55 μm, preferably 40 to 50 μm, and when the preheating temperature of the mold is 130° C., D50 may be 50 to 70 μm, preferably 55 to 65 μm.

As described above, it can be confirmed that as the preheating temperature of the mold increases, the heat and pressure applied to unexpanded particles included as the blowing agent increase and the diameter of the generated pores increases.

When curing is performed within the range of the preheating temperature of the mold of the present disclosure, the pores formed in the polishing layer have an appropriate diameter, such that defects may be prevented from occurring in the semiconductor substrate even when applied to the polishing process.

As described above, a physical method or a chemical method is used to form the pores in the polishing layer, and recently, a chemical method may be used in the manufacture of the polishing layer.

That is, pores are formed by injecting a liquid-phase blowing agent or gas as the blowing agent. However, in the case of the above method, it is not easy to control the size of the pores formed because the liquid-phase blowing agent is vaporized to form pores during the curing process, and it is not easy to control the size when forming pores even when gas is injected.

It is characterized in that the polishing layer is manufactured by molding a cured product obtained by curing a composition containing a polyurethane-based prepolymer, a curing agent, and a blowing agent, and the manufactured polishing layer includes a plurality of pores.

As described above, a physical method or a chemical method is used to form the pores in the polishing layer, and recently, a chemical method is used in the manufacture of the polishing layer.

That is, pores are formed by injecting a liquid-phase blowing agent or gas as the blowing agent. However, in the case of above method, it is not easy to control the size of the pores formed because the liquid-phase blowing agent is vaporized to form pores during the curing process, and it is not easy to control the size when forming pores even when gas is injected.

The blowing agent is an unexpanded particle 10 as illustrated in FIG. 2, and the unexpanded particle 10 may include a shell 11 made of a resin and an expansion-inducing component 12 enclosed in the shell.

The unexpanded particles 10 are particles that have not been pre-expanded, and refer to particles whose final size is determined by expansion by heat or pressure applied during the manufacturing process of the polishing layer.

The unexpanded particles 10 may be foamed by a curing process to form a plurality of pores in the polishing layer.

Conventionally, expanded particles used to manufacture the polishing layer are not separately expanded during the curing process. However, the blowing agent of the present disclosure may include unexpanded particles as the blowing agent 10, and may be expanded 20 during the curing process using the unexpanded particles 10 to form a plurality of pores.

The unexpanded particles 10 may include shell 11 made of a resin; and an expansion-inducing component 12 enclosed in the shell and present therein.

For example, the shell 11 may include a thermoplastic resin, and the thermoplastic resin may be one or more selected from the group consisting of a vinylidene chloride-based copolymer, an acrylonitrile-based copolymer, a methacrylonitrile-based copolymer, and an acryl-based copolymer.

The expansion-inducing component 12 may include one selected from the group consisting of a hydrocarbon compound, a chlorofluoro compound, a tetraalkylsilane compound, and combinations thereof.

Specifically, the hydrocarbon compound may include one selected from the group consisting of ethane, ethylene, propane, propene, n-butane, isobutane, n-butene, isobutene, n-pentane, isopentane, neopentane, n-hexane, heptane, petroleum ether, and combination thereof.

The chlorofluoro compound may include one selected from the group consisting of trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and combinations thereof.

The tetraalkylsilane compound may include one selected from the group consisting of tetramethylsilane, trimethylethylsilane, trimethylisopropylsilane, trimethyl-n-propylsilane, and combinations thereof.

Specifically, the unexpanded particles 10 include a shell 11 made of a thermoplastic resin and a hydrocarbon gas 12 inside the shell. The internal hydrocarbon gas may serve to expand the thermoplastic shell by heat applied during the curing process.

As described above, when the size of the polymer shell is expanded by the expansion, and the internal hydrocarbon gas is discharged to the outside, pores may be formed in the polishing layer, and the polymer shell may be included in the polishing layer.

The content of the solid blowing agent may be 0.5 parts by weight to 10 parts by weight, for example, 1 part by weight to 7 parts by weight, for example, 1 part by weight to 5 parts by weight based on 100 parts by weight of the urethane-based prepolymer. The type and content of the solid blowing agent may be designed according to the desired pore structure and physical properties of the polishing layer.

The composition for manufacturing the polishing layer according to the present disclosure may contain one selected from the group consisting of an expanded solid blowing agent, a gas-phase blowing agent, a liquid-phase blowing agent, and combinations thereof, as well as the unexpanded solid blowing agent described above.

The gas-phase blowing agent may include an inert gas. The gas-phase blowing agent may be introduced during a reaction between the urethane-based prepolymer and the curing agent and used as a pore-forming element.

The type of inert gas is not particularly limited as long as it does not participate in the reaction between the urethane-based prepolymer and the curing agent. For example, the inert gas may include one selected from the group consisting of nitrogen gas ($N_2$), argon gas (Ar), helium gas (He), and combinations thereof. Specifically, the inert gas may include nitrogen gas ($N_2$) or argon gas (Ar).

The type and content of the gas-phase blowing agent may be designed according to the desired pore structure and physical properties of the polishing layer.

The particles of the thermally expanded solid-phase blowing agent may have an average particle diameter of from about 5 μm to about 200 μm. The thermally expanded particles have an average particle diameter of from about 5 μm to about 100 μm, for example, from about 10 μm to about 80 μm, for example, from about 20 μm to about 70 μm, for example, from about 20 μm to about 50 μm, for example from about 30 μm to about 70 μm, for example, from about 25 μm to 45 μm, for example, from about 40 μm to about 70 μm, for example, from about 40 μm to about 60 μm. The average particle diameter is defined as the D50 of the thermally expanded particles.

In one embodiment, the thermally expanded particles may have a density of from about 30 kg/m³ to about 80 kg/m³, for example, from about 35 kg/m³ to about 80 kg/m³, for example, from about 35 kg/m³ to about 75 kg/m³, for example, from about 38 kg/m³ to about 72 kg/m³, for example, from about 40 kg/m³ to about 75 kg/m³, for example, from about 40 kg/m³ to about 72 kg/m³.

In one embodiment, the blowing agent may include a gas-phase blowing agent. For example, the blowing agent may include a solid-phase blowing agent and a gas-phase blowing agent. The matters related to the solid-phase blowing agent are the same as described above.

The gas-phase blowing agent may include nitrogen gas.

The gas-phase blowing agent may be injected through a predetermined injection line while the urethane-based prepolymer, the solid-phase blowing agent, and the curing agent are mixed. The injection rate of the gas-phase blowing agent may be from about 0.8 L/min to about 2.0 L/min, for example, from about 0.8 L/min to about 1.8 L/min, for example, from about 0.8 L/min to about 1.7 L/min, for example, from about 1.0 L/min to about 2.0 L/min, for example, from about 1.0 L/min to about 1.8 L/min, for example, from about 1.0 L/min to about 1.7 L/min.

In one embodiment, the polishing layer may include a polishing layer including a cured product formed from a composition containing a urethane-based prepolymer, a curing agent, and a blowing agent. The blowing agent is the same as described above, and will be excluded from the description below.

Hereinafter, each component contained in the composition will be described in detail.

"Prepolymer" refers to a polymer having a relatively low molecular weight in which the degree of polymerization is stopped at an intermediate stage to facilitate molding in the preparation of a cured product. The prepolymer may be molded into a final cured product either on its own or after reacting with other polymerizable compounds.

In one embodiment, the urethane-based prepolymer may be prepared by reacting an isocyanate compound with a polyol.

As the isocyanate compound used in the preparation of the urethane-based prepolymer, one selected from the group consisting of aromatic diisocyanate, aliphatic diisocyanate, cycloaliphatic diisocyanate, and combinations thereof may be used.

The isocyanate compound may include, for example, one selected from the group consisting of 2,4-toluenediisocyanate (2,4-TDI), 2,6-toluenediisocyanate (2,6-TDI) naphthalene-1,5-diisocyanate, p-phenylenediisocyanate, tolidinediisocyanate, 4,4'-diphenylmethane diisocyanate, hexamethylenediisocyanate, dicyclohexylmethanediisocyanate, isophorone diisocyanate, and combinations thereof.

"Polyol" refers to a compound containing at least two hydroxyl groups (—OH) per molecule. The polyol may include, for example, one selected from the group consisting of polyether polyol, polyester polyol, polycarbonate polyol, acryl polyol, and combinations thereof.

The polyol may include, for example, one selected from the group consisting of polytetramethylene ether glycol, polypropylene ether glycol, ethylene glycol, 1,2-propylene glycol, 1,3-propylene glycol, 1,2-butanediol, 1,3-butanediol, 2-methyl-1,3-propanediol, 1,4-butanediol, neopentyl glycol, 1,5-pentanediol, 3-methyl-1,5-pentanediol, 1,6-hexanediol, diethylene glycol, dipropylene glycol, tripropylene glycol, and combinations thereof.

The polyol may have a weight average molecular weight (Mw) of about 100 g/mol to about 3,000 g/mol. The polyol may have a weight average molecular weight (Mw) of, for example, about 100 g/mol to about 3,000 g/mol, for example, from about 100 g/mol to about 2,000 g/mol, for example, from about 100 g/mol to about 1,800 g/mol.

In one embodiment, the polyol may include a low molecular weight polyol having a weight average molecular weight (Mw) of about 100 g/mol or more and less than about 300 g/mol, and a high molecular weight polyol having a weight average molecular weight (Mw) of about 300 g/mol or more and about 1,800 g/mol or less.

The urethane-based prepolymer may have a weight average molecular weight (Mw) of about 500 g/mol to about 3,000 g/mol. The urethane-based prepolymer may have a weight average molecular weight (Mw) of, for example, about 600 g/mol to about 2,000 g/mol, for example, about 800 g/mol to about 1,000 g/mol.

In one embodiment, the isocyanate compound for preparing the urethane-based prepolymer may include an aromatic diisocyanate compound, and the aromatic diisocyanate compound may include, for example, 2,4-toluene diisocyanate (2,4-TDI) and 2,6-toluenediisocyanate (2,6-TDI). The polyol compound for preparing the urethane-based prepolymer may include polytetramethylene ether glycol (PTMEG) and diethylene glycol (DEG).

In another embodiment, the isocyanate compound for preparing the urethane-based prepolymer may include an aromatic diisocyanate compound and an alicyclic diisocyanate compound. For example, the aromatic diisocyanate compound may include 2,4-toluene diisocyanate (2,4-TDI) and 2,6-toluene diisocyanate (2,6-TDI), and the alicyclic diisocyanate compound may include dicyclohexylmethane diisocyanate (H12MDI). The polyol compound for preparing the urethane-based prepolymer may include polytetramethylene ether glycol (PTMEG) and diethylene glycol (DEG).

The urethane-based prepolymer may have an isocyanate end group content (NCO %) of about 5% to about 11% by weight, for example, about 5% to about 10% by weight, for example, about 5% to about 8% by weight, for example, about 8% to about 10% by weight. If the NCO % is within the above range, proper physical properties of the polishing layer in the polishing pad may be exhibited to maintain polishing performance required for the polishing process such as a polishing rate and a polishing profile, and to minimize defects that may be generated on the wafer during the polishing process.

In addition, dishing, recess, and erosion may be prevented and surface planarization in the wafer may be achieved, by adjusting polishing selectivity (Ox RR/Nt RR) of an oxide film and a nitride film.

The isocyanate end group content (NCO %) of the urethane-based prepolymer may be designed by comprehensively adjusting the type and content of the isocyanate compound and the polyol compound for preparing the urethane-based prepolymer, process conditions such as temperature, pressure, and time of the process for preparing the urethane-based prepolymer, and the type and content of additives used in the preparation of the urethane-based prepolymer, etc.

The curing agent is a compound for chemically reacting with the urethane-based prepolymer to form a final cured structure in the polishing layer, and may include, for example, an amine compound or an alcohol compound. Specifically, the curing agent may include one selected from the group consisting of aromatic amines, aliphatic amines, aromatic alcohols, aliphatic alcohols, and combinations thereof.

For example, the curing agent may include one selected from the group consisting of 4,4'-methylenebis(2-chloroaniline) (MOCA), diethyltoluenediamine (DETDA), diaminodiphenylmethane, dimethyl thio-toluene diamine (DMTDA), propanediol bis p-aminobenzoate, methylene bis-methylanthranilate, diaminodiphenylsulfone, m-xylenediamine, isophoronediamine, ethylenediamine, diethylenetriamine, triethylenetetramine, polypropylenediamine, polypropylenetriamine, bis (4-amino-3-chlorophenyl) methane, and combinations thereof.

The content of the curing agent may be about 18 parts by weight to about 27 parts by weight, for example, about 19 parts by weight to about 26 parts by weight, for example, about 20 parts by weight to about 26 parts by weight based on 100 parts by weight of the urethane-based prepolymer. When the content of the curing agent is within the above range, it may be more advantageous to realize the desired performance of the polishing pad.

The composition for preparing the polishing layer may further include other additives such as a surfactant and a reaction rate regulator. The terms such as "surfactant" and "reaction rate regulator" are terms that are arbitrarily designated based on the main role of the substance, and each corresponding substance does not necessarily perform only a function limited to the role by the corresponding term.

The surfactant is not particularly limited as long as it is a material that serves to prevent aggregation or overlapping, etc., of pores. For example, the surfactant may include a silicon-based surfactant.

The surfactant may be used in an amount of about 0.2 parts by weight to about 2 parts by weight based on 100 parts by weight of the urethane-based prepolymer. Specifically, the surfactant may be included in an amount of about 0.2 parts by weight to about 1.9 parts by weight, for example, about 0.2 parts by weight to about 1.8 parts by weight, for example, about 0.2 parts by weight to about 1.7 parts by weight, for example, about 0.2 parts by weight to about 1.6 parts by weight, for example, about 0.2 parts by weight to about 1.5 parts by weight, for example, about 0.5 parts by weight to 1.5 parts by weight based on 100 parts by weight of the urethane-based prepolymer. When the surfactant is included in an amount within the above range, pores derived from the gas-phase blowing agent may be stably formed and maintained in the mold.

The reaction rate regulator serves to promote or delay the reaction, and a reaction accelerator, a reaction retarder, or both may be used depending on the purpose. The reaction rate regulator may include a reaction accelerator. For example, the reaction accelerator may be one or more reaction accelerators selected from the group consisting of a tertiary amine-based compound and an organometallic compound.

Specifically, the reaction rate regulator may include one or more selected from the group consisting of triethylenediamine, dimethylethanolamine, tetramethylbutanediamine, 2-methyl-triethylenediamine, dimethylcyclohexylamine, triethylamine, triisopropanolamine, 1,4-diazabicyclo(2,2,2)octane, bis(2-methylaminoethyl)ether, trimethylaminoethylethanolamine, N,N,N,N,N''-pentamethyldiethylenetriamine, dimethylaminoethylamine, dimethylamino propylamine, benzyldimethylamine, N-ethylmorpholine, N,N-dimethylaminoethylmorpholine, N,N-dimethylcyclohexylamine, 2-methyl-2-azanovonein, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate regulator may include one or more selected from the group consisting of benzyldimethylamine, N,N-dimethylcyclohexylamine, and triethylamine.

The reaction rate regulator may be used in an amount of from about 0.05 parts by weight to about 2 parts by weight based on 100 parts by weight of the urethane-based prepolymer. Specifically, the reaction rate regulator may be used in an amount of from about 0.05 parts by weight to about 1.8 parts by weight, for example, from about 0.05 parts by weight to about 1.7 parts by weight, for example, from about 0.05 parts by weight to about 1.6 parts by weight, for example, from about 0.1 parts by weight to about 1.5 parts by weight, for example, from about 0.1 parts by weight to about 0.3 parts by weight, for example, from about 0.2 parts by weight to about 1.8 parts by weight, for example, from about 0.2 parts by weight to about 1.7 parts by weight, for example, from about 0.2 parts by weight to about 1.6 parts by weight, for example, from about 0.2 parts by weight to about 1.5 parts by weight, for example, from about 0.5 parts by weight to about 1 part by weight based on 100 parts by weight of the urethane-based prepolymer. When the reaction rate regulator is used in the above-described content range, the curing reaction rate of the prepolymer composition may be appropriately adjusted to form a polishing layer having pores of a desired size and hardness.

When the polishing pad includes a cushion layer, the cushion layer serves to absorb and disperse an external impact applied to the polishing layer while supporting the polishing layer, thereby minimizing damage and defects to the polishing object during the polishing process to which the polishing pad is applied.

The cushion layer may include, but is not limited to, a nonwoven fabric or suede.

In one embodiment, the cushion layer may be a resin-impregnated nonwoven fabric. The nonwoven fabric may be a fiber nonwoven fabric including one selected from the group consisting of polyester fibers, polyamide fibers, polypropylene fibers, polyethylene fibers, and combinations thereof.

The resin impregnated into the nonwoven fabric may include one selected from the group consisting of a polyurethane resin, a polybutadiene resin, a styrene-butadiene copolymer resin, a styrene-butadiene-styrene copolymer resin, an acrylonitrile-butadiene copolymer resin, a styrene-ethylene-butadiene-styrene copolymer resin, a silicon rubber resin, a polyester-based elastomer resin, a polyamide-based elastomer resin, and combinations thereof.

Hereinafter, a method of manufacturing the polishing pad will be described in detail.

In another embodiment according to the present disclosure, there may be provided a method of manufacturing a polishing pad including: preparing a prepolymer composition; preparing a composition for manufacturing a polishing layer, containing the prepolymer composition, a blowing agent and a curing agent; and curing the composition for manufacturing a polishing layer to prepare a polishing layer.

The preparing of the prepolymer composition may be a process of preparing a urethane-based prepolymer by reacting a diisocyanate compound and a polyol compound. The matters related to the diisocyanate compound and the polyol compound are the same as those described above with respect to the polishing pad.

The isocyanate group (NCO group) content of the prepolymer composition may be, from about 5% to about 15% by weight, for example, from about 5% to about 8% by weight, for example, from about 5% to about 7% by weight, for example, from about 8% to about 15% by weight, for example, from about 8% to about 14% by weight, for example, from about 8% to about 12% by weight, for example, 8% to about 10% by weight.

The isocyanate group content of the prepolymer composition may be derived from end isocyanate groups of the urethane-based prepolymer, unreacted isocyanate groups in the diisocyanate compound, etc.

The prepolymer composition may have a viscosity of from about 100 cps to about 1,000 cps at about 80° C., for example, from about 200 cps to about 800 cps, for example, from about 200 cps to about 600 cps, for example, about 200 cps to about 550 cps, for example, from about 300 cps to about 500 cps.

The blowing agent may include an unexpanded solid blowing agent as described above, and a blowing agent selected from the group consisting of an expanded solid blowing agent, a liquid-phase blowing agent, a gas-phase blowing agent, and a mixture thereof may be used in admixture with the unexpanded solid blowing agent.

For example, the blowing agent may include unexpanded solid-phase blowing agents and expanded solid-phase blowing agents, may include an unexpanded solid-phase blowing agent, an expanded solid-phase blowing agent, and gas-phase blowing agent, may include an unexpanded solid-phase blowing agent and a liquid-phase blowing agent, may include an unexpanded solid-phase blowing agent, a liquid-phase blowing agent, and a gas-phase blowing agent, and may include an unexpanded solid-phase blowing agent, an expanded solid-phase blowing agent, a liquid-phase blowing agent, and a gas-phase blowing agent, wherein the blowing agent includes an unexpanded solid-phase blowing agent, and the type and content of the blowing agent may be designed according to the desired pore structure and physical properties of the polishing layer.

When the blowing agent includes a solid-phase blowing agent, the preparing of the composition for manufacturing a polishing layer may include: preparing a first preliminary composition by mixing the prepolymer composition with the solid-phase blowing agent; and preparing a second preliminary composition by mixing the first preliminary composition with a curing agent.

The first preliminary composition may have a viscosity of about 1,000 cps to about 2,000 cps at about 80° C., for example, about 1,000 cps to about 1,800 cps, for example, about 1,000 cps to about 1,600 cps, for example, about 1,000 cps to about 1,500 cps.

When the blowing agent includes a gas-phase blowing agent, the preparing of the composition for manufacturing the polishing layer may include: preparing a third preliminary composition containing the prepolymer composition and the curing agent; and preparing a fourth preliminary composition by injecting the gas-phase blowing agent into the third preliminary composition.

In one embodiment, the third preliminary composition may further contain a solid-phase blowing agent.

In one embodiment, the process of manufacturing the polishing layer may include: preparing a mold preheated to a first temperature; injecting and curing a composition for manufacturing a polishing layer into the preheated mold; and post-curing the cured composition for manufacturing a polishing layer under a second temperature condition higher than the preheating temperature.

In one embodiment, the first temperature may be from about 60° C. to about 100° C., for example, from about 65° C. to about 95° C., for example, from about 70° C. to about 90° C.

In one embodiment, the second temperature may be from about 100° C. to about 130° C., for example, from about 100° C. to 125° C., for example, from about 100° C. to about 120° C.

The curing of the composition for manufacturing a polishing layer under the first temperature may be carried out for about 5 minutes to about 60 minutes, for example, about 5 minutes to about 40 minutes, for example, about 5 minutes to about 30 minutes, for example, about 5 minutes to about 25 minutes.

The post-curing of the composition for manufacturing a polishing layer cured under the first temperature under the second temperature, may be carried out for about 5 hours to about 30 hours, for example, about 5 hours to about 25 hours, for example, about 10 hours to about 30 hours, for example, about 10 hours to about 25 hours, for example, about 12 hours to about 24 hours, for example, about 15 hours to about 24 hours.

The solid-phase blowing agent of the present disclosure is an unexpanded particle, and the unexpanded particle included in the composition for manufacturing a polishing layer is expanded by heat and pressure provided during a curing process to form a plurality of pores in the polishing layer.

Specifically, as shown in FIG. 3, when the composition for manufacturing a polishing layer is injected into a preheated mold and the curing process 30 proceeds, the unexpanded particles 10 contained in the composition for manufacturing a polishing layer are expanded and a plurality of pores (40) are formed.

The method of manufacturing the polishing pad may include processing at least one surface of the polishing layer. The processing step may be to form a groove.

In another embodiment, the processing of at least one surface of the polishing layer may include at least one step of: (1) forming a groove on at least one surface of the polishing layer; (2) line turning at least one surface of the polishing layer; and (3) roughening at least one surface of the polishing layer.

In the step (1), the groove may include at least one of concentric groove formed spaced apart from the center of the polishing layer at a predetermined interval; and a radial groove continuously connected from the center of the polishing layer to an edge of the polishing layer.

In the step (2), the line turning may be performed by using a cutting tool to cut the polishing layer by a predetermined thickness.

In the step (3), the roughening may be carried out by processing the surface of the polishing layer with a sanding roller.

The method of manufacturing a polishing pad may further include laminating a cushion layer on a back surface of the polishing surface of the polishing layer.

The polishing layer and the cushion layer may be stacked through a heat melt adhesive.

The heat melt adhesive may be applied onto a back surface of the polishing surface of the polishing layer, the heat melt adhesive may be applied onto a surface of the cushion layer to be in contact with the polishing layer, and the polishing layer and the cushion layers may be stacked so that the surfaces onto which the respective heat melt adhesives are applied are in contact with each other, and the polishing layer and the cushion layer may be then fused using a pressurization roller.

In another example, a method of manufacturing a polishing pad includes providing a polishing pad including a polishing layer; and grinding a target to be polished while rotating the target to be polished and the polishing layer relative to each other so that a polished surface of the target to be polished is in contact with a polishing surface of the polishing layer.

FIG. 4 is a schematic process diagram of a process of manufacturing a semiconductor device according to an embodiment of the present disclosure. Referring to FIG. 4, the polishing pad 110 according to the embodiment is mounted on a surface plate 120, a semiconductor substrate 130, which is a target to be polished, is disposed on the polishing pad 110. In this case, a polished surface of the semiconductor substrate 130 is in direct contact with a polishing surface of the polishing pad 110. For polishing, a polishing slurry 150 may be sprayed on the polishing pad through the nozzle 140. A flow rate of the polishing slurry 150 supplied through the nozzle 140 may be selected according to a purpose in the range of about 10 $cm^3$/min to about 1,000 $cm^3$/min, and may be, for example, from about 50 $cm^3$/min to about 500 $cm^3$/min, but is not limited thereto.

Thereafter, the semiconductor substrate 130 and the polishing pad 110 are rotated relative to each other, such that the surface of the semiconductor substrate 130 may be polished. In this case, a rotation direction of the semiconductor substrate 130 and a rotation direction of the polishing pad 110 may be the same as or be opposite to each other. Rotation speeds of the semiconductor substrate 130 and the polishing pad 110 may be selected according to a purpose in the range of about 10 rpm to about 500 rpm, respectively, and may be, for example, about 30 rpm to about 200 rpm, but is not limited thereto.

The semiconductor substrate 130 may be pressurized against the polishing surface of the polishing pad 110 with a predetermined load in a state in which it is mounted on a polishing head 160, to be in contact with the polishing surface, and the surface of the semiconductor substrate 130 may be then polished. The load applied to the polishing surface of the polishing pad 110 on the surface of the semiconductor substrate 130 by the polishing head 160 may be selected according to a purpose in the range of about 1 $gf/cm^2$ to about 1,000 $gf/cm^2$, and may be, for example, about 10 $gf/cm^2$ to about 800 $gf/cm^2$, but is not limited thereto.

In one embodiment, the method of manufacturing a semiconductor device may further include processing the polishing surface of the polishing pad 110 through a conditioner 170 simultaneously with the polishing of the semiconductor substrate 130 in order to maintain the polishing surface of the polishing pad 110 in a state suitable for polishing.

Hereinafter, specific Examples of the present disclosure will be provided. However, Examples described below are merely for specifically illustrating or describing the present disclosure, and the present disclosure is not limited thereto.

Example 1

Manufacture of Polishing Pad

TDI, $H_{12}$MDI, polytetramethylene ether glycol, and diethylene glycol were injected to a four-neck flask and reacted with each other at 80° C. for 3 hours to prepare a prepolymer having NCO % of 8 to 12%.

In order to manufacture a polishing layer (top pad), in a casting machine provided with a prepolymer, a hardener, an inert gas injection line, and a liquid-phase blowing agent injection line, the prepared prepolymer was filled in a prepolymer tank, bis(4-amino-3-chlorophenyl) methane (available from Ishihara Corporation) was filled in a hardener tank, nitrogen ($N_2$) was prepared as an inert gas, and FC3283 (available from 3M Company) was prepared as a liquid-phase blowing agent. An unexpanded solid blowing agent (551DU40 available from Akzo Nobel N.V.) and a silicon-based surfactant (available from Evonik Industries) were pre-mixed with the prepolymer.

A composition of a shell of the unexpanded solid-phase blowing agent was polyvinylidene chloride or acrylonitrile.

During casting, the prepolymer and the hardener were discharged at a rate of 10 kg per minute by adjusting equivalents of the prepolymer and the hardener to 1:1, nitrogen ($N_2$), which is the inert gas, was injected in an amount of % volume ratio of each Example compared to the volume of the total flow amount, and respective injected raw materials were mixed with each other at high revolutions per minute (RPM) in a mixing head, and then injected into a mold preheated to 100° C. and having a width of 1,000 mm, a length of 1,000 mm, and a height of 3 mm.

In this case, a sheet for a polishing layer (top pad) in which pores are formed was manufactured by adjusting an amount of nitrogen, which is the inert gas, to maintain a density of 0.7 to 0.9. Thereafter, a surface of the manufactured porous polyurethane sheet was grinded using a grinding machine and grooved using a tip to prepare an average thickness of 2 mm and an average diameter of 76.2 cm.

A polishing pad was manufactured by heat-sealing the polyurethane sheet and suede (base layer, average thickness: 1.1 mm) at 120° C. using a hot melt film (manufacturer: SKC, product name: TF-00).

Example 2

A polishing pad was manufactured in the same manner as in Example 1 except that unexpanded 031DU40 (available from Akzo Nobel N.V.) was used as the solid-phase blowing agent. A composition of a shell of the solid-phase blowing agent was polyvinylidene chloride or acrylonitrile.

Comparative Example 1

A polishing pad was manufactured in the same manner as in Example 1 except that 461DET40d25 (available from Akzo Nobel N.V.), which is an expanded solid-phase blowing agent, was used as the solid-phase blowing agent.

Comparative Example 2

A polishing pad was manufactured in the same manner as in Example 1 except that 551DE40d42 (available from Akzo Nobel N.V.), which is an expanded solid-phase blowing agent, was used as the solid-phase blowing agent.

Contents, manufacturing conditions, etc., for Examples and Comparative Examples are shown in Table 1 below.

TABLE 1

|  | Example 1 | Example 2 | Comparative Example 1 | Comparative Example 2 |
|---|---|---|---|---|
| Content (%) of NCO of prepolymer | 9% | 9% | 9% | 9% |
| Casting mold Type | Single sheet | Single sheet | Single sheet | Single sheet |
| Solid-phase blowing agent | 551DU40 (Unexpanded) | 031DU40 (Unexpanded) | 461DET40d25 (Expanded) | 551DE40d42 (Expanded) |
| Sheet processing sequence (casting, cutting, groove) | Sequential | Sequential | Sequential | Sequential |
| Prepolymer (parts by weight) | 100 | 100 | 100 | 100 |
| Surfactant (parts by weight) | 1 | 1 | 1 | 1 |
| Solid-phase blowing agent (parts by weight) | 3 | 3 | 3 | 3 |
| Inlet gas (L/min) | 0.3 | 0.3 | 0.3 | 0.3 |

Example 3

Manufacture of Polishing Pad

TDI, $H_{12}$MDI, polytetramethylene ether glycol, and diethylene glycol were injected to a four-neck flask and reacted with each other at 80° C. for 3 hours to prepare a prepolymer having NCO % of 8 to 12%.

In order to manufacture a polishing layer (top pad), in a casting machine provided with a prepolymer, a hardener, an inert gas injection line, and a liquid-phase blowing agent injection line, the prepared prepolymer was filled in a prepolymer tank, bis(4-amino-3-chlorophenyl) methane (Ishihara Corporation) was filled in a hardener tank, nitrogen ($N_2$) was prepared as an inert gas, and FC3283 (3M Company) was prepared as a liquid-phase blowing agent.

A solid blowing agent (551DU40 available from Akzo Nobel N.V.) and a silicon-based surfactant (available from Evonik Industries) were pre-mixed with the prepolymer in separate lines.

During casting, the prepolymer and the hardener were discharged at a rate of 10 kg per minute by adjusting equivalents of the prepolymer and the hardener to 1:1, nitrogen ($N_2$), which is the inert gas, was injected in an amount compared to a volume of the total flow amount, and respective injected raw materials were mixed with each other through stirring in a mixing head, and then injected into and hardened in a mold preheated to 100° C. and having a width of 1000 mm, a length of 1000 mm, and a height of 3 mm. In this case, a porous polyurethane sheet was manufactured by adjusting an amount of nitrogen, which is the inert gas, to adjust a density to 0.7 to 0.9 and injecting into the mold.

Thereafter, a surface of the manufactured porous polyurethane sheet was grinded using a grinding machine, and was manufactured at a size of an average thickness of 2 mm and an average diameter of 76.2 cm through a process of performing grooving using a tip.

A polishing pad was manufactured by heat-sealing the polyurethane sheet and suede (base layer, average thickness: 1 mm) at 120° C. using a hot melt film (manufacturer: SKC, product name: TF-00).

Example 4

A polishing pad was manufactured in the same manner as in Example 1 except that a preheating temperature of the mold was adjusted to 115° C.

Example 5

A polishing pad was manufactured in the same manner as in Example 1 except that a preheating temperature of the mold was adjusted to 130° C.

Comparative Example 3

A polishing pad was manufactured in the same manner as in Example 1 except that the mold was not preheated.

Comparative Example 4

A polishing pad was manufactured in the same manner as in Example 1 except that a preheating temperature of the mold was adjusted to 180° C.

Contents, manufacturing conditions, etc., for Examples and Comparative Examples are shown in Table 2 below.

TABLE 2

| | Example 3 | Example 4 | Example 5 | Comparative Example 3 | Comparative Example 4 |
| --- | --- | --- | --- | --- | --- |
| Content (%) of NCO of prepolymer | 8% | 8% | 8% | 8% | 8% |
| Casting mold Type | Closed type, single sheet | Closed type, single sheet | Closed type, single sheet | Closed type, single sheet | Closed type, single sheet |
| Preheating temperature (° C.) of casting mold | 100° C. | 115° C. | 130° C. | Room temperature | 180° C. |
| Sheet processing (casting, cutting, groove) | Sequential | Sequential | Sequential | Sequential | Sequential |
| Prepolymer (parts by weight) | 100 | 100 | 100 | 100 | 100 |
| Surfactant (parts by weight) | 1 | 1 | 1 | 1 | 1 |
| Solid-phase blowing agent (parts by weight) | 3 | 3 | 3 | 3 | 3 |
| Inlet gas (L/min) | 0.3 | 0.3 | 0.3 | 0.3 | 0.3 |

Experimental Example 1

Evaluation of Physical Properties of Polishing Layer (1) Hardness

Shore D hardness of the polishing pads manufactured according to Examples and Comparative Examples was measured, and polishing pads were cut to a size of 2 cm×2 cm (thickness: 2 mm), and left in an environment of a temperature of 25° C. and a humidity of 50±5% for 16 hours. Thereafter, the hardness of the polishing pads was measured using a durometer (D-type durometer).

(2) Elastic Modulus

For each of the polishing pads manufactured according to Examples and Comparative Examples, the highest strength value just before fracture was acquired while performing a test at a speed of 500 mm/min using a universal testing machine (UTM), and a gradient in a region of 20 to 70% of a Strain-Stress curve was then calculated through the acquired value.

(3) Elongation

For each of the polishing pads manufactured according to Examples and Comparative Examples, a maximum deformation amount just before fracture was measured while performing a test at a speed of 500 mm/min using a universal testing machine (UTM), and a ratio of the maximum deformation amount to an initial length was then expressed as a percentage (%).

(4) Tension

For each of the polishing pads manufactured according to Examples and Comparative Examples, the highest strength value just before fracture was acquired while performing a test at a speed of 500 mm/min using a universal testing machine (UTM), and a gradient in a region of 20 to 70% of a Strain-Stress curve was then calculated through the acquired value.

(5) Specific Gravity

Specific gravities of windows manufactured according to Examples and Comparative Examples were measured, and polishing pads were cut to a size of 2 cm×2 cm (thickness: 2 mm), and left in an environment of a temperature of 25° C. and a humidity of 50±5% for 16 hours. Thereafter, initial weights and weights of the polishing pads when immersed in water were measured using an electronic densimeter, and densities were then calculated.

TABLE 3

| Evaluation item | Example 1 | Example 2 | Comparative Example 1 | Comparative Example 2 |
|---|---|---|---|---|
| Thickness (mm) | 2 | 2 | 2 | 2 |
| Hardness (Shore D) | 57.8 | 58.2 | 57.5 | 57.3 |
| Specific gravity (g/cc) | 0.78 | 0.78 | 0.78 | 0.78 |
| Tension (N/mm$^2$) | 22.3 | 22.2 | 21.8 | 21.1 |
| Elongation (%) | 88.1 | 87.2 | 85.6 | 90.6 |
| Elastic modulus | 102.1 | 105.3 | 101.1 | 109.1 |

Table 3 represents evaluation results of physical properties for Examples 1 and 2 and Comparative Examples 1 and 2. According to the above experiment results, it may be confirmed that there is no large difference in physical properties between the polishing layers according to Inventive Examples and the polishing layers according to Comparative Examples. This will mean that a difference in the blowing agent does not affect physical properties of the polishing layers.

TABLE 4

| Evaluation item | Example 3 | Example 4 | Example 5 | Comparative Example 3 | Comparative Example 4 |
|---|---|---|---|---|---|
| Thickness (mm) | 2 | 2 | 2 | 2 | 2 |
| Hardness (Shore D) | 57.8 | 58.7 | 57.9 | 72.3 | 70.1 |
| Specific gravity (g/cc) | 0.78 | 0.78 | 0.78 | 1.08 | 0.97 |
| Tension (N/mm$^2$) | 22.3 | 22.2 | 22 | 55.39 | 54.073 |
| Elongation (%) | 87.5 | 81.9 | 71.0 | 227.08 | 227.09 |
| Elastic modulus | 105.4 | 133.1 | 182.7 | 11.75 | 13.97 |

Table 4 represents evaluation results of physical properties for Examples 3 to 5, Comparative Examples 3 and 5. It was confirmed that in a case of Inventive Examples, the hardnesss (Shore D) were in the range of 57 to 59, which were numeral values lower than those (72.3 and 70.1) of Comparative Examples, and specific gravities were 0.78, which showed a different from those of Comparative Examples, tensions (N/mm$^2$) were 22 to 23, elongations (%) were 70 to 90, and elastic moduli were 100 to 200, which showed a large difference from those of Comparative Example.

According to the evaluation results of the physical properties, it was confirmed that the polishing layers according to Examples showed lower numerical values in physical properties indicating a degree of hardness than Comparative Examples, and showed higher numeral values in elasticity than Comparative Examples. In light of the above results and polishing evaluation results to be described later, the polishing pad according to the present disclosure may prevent occurrence of defects when being applied to a polishing process compared to Comparative Examples due to the physical properties as described above.

Experimental Example 2

Measurement of Size of Pore of Polishing Layer

Diameter sizes of pores for the polishing layers according to Examples and Comparative Examples were measured. Specifically, cross sections of polishing surfaces of 1 mm$^2$ cut into a square (thickness: 2 mm) of 1 mm×1 mm were observed from images magnified by 100 times using a scanning electron microscope (SEM). Diameters of all pores were measured from images obtained using image analysis software to obtain the number average diameter of pores, a distribution of the sum of cross-sectional areas for each pore diameter, the number of pores, and a total area of the pores. Width/length of the image magnified by 100 times using the SEM is 959.1 μm/1279 μm.

Measurement results are represented in Table 5 below.

TABLE 5

|  | Example 1 | Example 2 | Comparative Example 1 | Comparative Example 2 |
|---|---|---|---|---|
| D10 | 15.93 | 11.97 | 22.93 | 24.12 |
| D20 | 18.10 | 15.03 | 27.85 | 28.59 |
| D30 | 19.58 | 17.02 | 30.59 | 32.93 |
| D40 | 20.55 | 19.25 | 33.72 | 36.93 |
| D50 | 21.62 | 21.11 | 36.15 | 39.73 |
| D60 | 22.72 | 23.10 | 38.76 | 45.57 |
| D70 | 23.75 | 25.61 | 42.06 | 50.81 |
| D80 | 24.79 | 28.96 | 47.40 | 55.23 |
| D90 | 27.18 | 35.02 | 53.34 | 60.76 |
| D10/D50 | 0.74 | 0.57 | 0.63 | 0.61 |
| D50/D90 | 0.80 | 0.60 | 0.68 | 0.65 |
| Standard deviation | 3.48 | 7.20 | 9.61 | 12.39 |

As represented in Table 5, it may be confirmed that in the polishing layers according to Examples 1 and 2, size distributions of pores were uniform and standard deviations of D10 to D90 were 3.48 to 7.20. On the other hand, it was confirmed that in Comparative Examples, there was no large difference in values of D10/D50 and D50/D90, but standard deviations showed large numeral values, and thus, size distributions of the pores were not relatively uniform compared to the polishing layer according to the present disclosure.

In addition, the sizes of the pores as described above were additionally confirmed through measurement using the SEM, and it may be confirmed that the sizes of the pores were uniformly distributed in the polishing layers according to Examples and the size distributions of the pores were non-uniform in Comparative Examples, as a result of confirming the sizes of the pores from images magnified by 100 times as illustrated in FIGS. 5 to 8.

TABLE 6

| Item |  | Unit | Example 3 | Example 4 | Example 5 | Comparative Example 3 | Comparative Example 4 |
|---|---|---|---|---|---|---|---|
| Pore Size | D10 | μm | 15.9 | 20.8 | 39.5 | 9.1 | 119.5 |
|  | D50 |  | 21.6 | 46.5 | 63.6 | 11.3 | 261.8 |
|  | D90 |  | 27.2 | 74.1 | 76.2 | 15.2 | 285.9 |
| $\overline{(D90-D50)}$ $\overline{(D50-D10)}$ |  |  | 0.98 | 1.07 | 0.52 | 1.77 | 0.17 |

As represented in Table 6, it may be confirmed that the size distributions of the pores in the polishing layers according to Examples were uniform. On the other hand, it may be confirmed that a difference between the sizes of the pores appeared due to a preheating temperature of the mold in Comparative Examples, the sizes of the pores were excessively small and the size distributions of the pores were not uniform in Comparative Example 1, and the sizes of the pores were excessively large, and the size distributions of the pores were not similarly uniform in Comparative Example 2.

In addition, the sizes of the pores as described above were additionally confirmed through measurement using the SEM, and it may be confirmed that the sizes of the pores were uniformly distributed in the polishing layers according to Examples illustrated in FIGS. 9 to 11 and the size distributions of the pores were non-uniform in Comparative Examples illustrated in FIGS. 12 and 13, as a result of confirming the sizes of the pores from images magnified by 100 times as illustrated in FIGS. 9 to 13.

Experimental Example 3

Measurement of Real Contact Area of Polishing Layer

In a state in which a polishing pad for which a CMP process was completed was wet while mounted on a surface plate, a surface roughness of the polishing pad was measured using wet on an S neox model available from Sensofra Group. Detailed conditions for measuring the surface roughness were represented in Table 7, and an embossed portion of a groove at a point corresponding to ½ of a radius of the polishing pad was measured. The measurement was performed a total of 5 times per polishing pad, and an average value was calculated.

TABLE 7

| Category | Value |
|---|---|
| Topography | 1224 × 1024 px |
| Area | 1689.12 × 1413.12 μm$^2$ |
| Pixel size | 1.4 μm/pixel |
| Z scan | 110 um |
| Threshold | 1% |
| Magnification | 10 |

According to Table 7, a volume is calculated by applying a material ratio in at least 0% and at most 3% using a senso view program, that is, in a material ratio of a section of 0 to 3% with respect to measured raw data. A real contact area (RCA) refers to an area where a surface of the polishing layer really rubs against a wafer under a pressurization condition by the wafer. Therefore, when it is assumed that a material ratio of about 3% is compressed when the surface of the polishing layer is compressed by pressurization, it can be considered that an area value of an island among volume numerical values of the senso view program corresponds to the RCA.

Measurement results of the RCA are illustrated in FIGS. 14 to 16 and Table 8.

TABLE 8

|  | Example 1 | Example 2 | Comparative Example 1 | Comparative Example 2 |
|---|---|---|---|---|
| Area(mm$^2$) | 0.048854 | 0.047161 | 0.013691 | 0.01537 |

According to Table 8, it can be seen that area where the polishing layers according to Inventive Examples are in contact with the wafer were larger than that of Comparative Examples. The surfaces of the polishing layers are not completely flat, and surface roughnesses are formed on the surfaces of the polishing layers, and measurement values of the RCA are affected by the surface roughnesses. In light of the measurement results, it may be confirmed that the real contact areas with the wafer were larger in the polishing layers according to Inventive Examples than in the polishing layers according to Comparative Examples.

Experimental Example 4

Measurement of Polishing Performance of Polishing Pad
(1) Measurement of Polishing Rate After a silicon wafer on which silicon oxide is deposited by a CVD process and which has a diameter of 300 mm was installed using a CMP polishing equipment, a silicon oxide layer of the silicon wafer was turned down, and was set on a surface plate to which the polishing pads according to Examples and Comparative Examples were bonded. Thereafter, a polishing load was adjusted to be 4.0 psi, and the silicon oxide film was polished by rotating the surface plate at 150 rpm for 60 seconds while injecting a calcined ceria slurry onto the polishing pad at a rate of 250 ml/min while rotating the polishing pad at 150 rpm.

After the silicon oxide film was polished, the silicon wafer was removed from a carrier, mounted on a spin dryer, cleaned with purified water (DIW), and then dried with nitrogen for 15 seconds. A change in a thickness of the film before and after the silicon oxide film was polished in the dried silicon wafer was measured using an optical interference thickness measuring device (manufacturer: Kyence Corp., model name: SI-F80R). Thereafter, a polishing rate was calculated using the following Equation 4.

Polishing rate=polishing thickness (Å) of silicon wafer/polishing time (60 seconds)  [Equation 4]

(2) Measurement of Polishing Pad Cut-Rate (µm/Hr)

The polishing pads including the polishing layers according to Examples and Comparative Examples were pre-conditioned with deionized water for initial 10 minutes, and then conditioned while sprayed with deionized water for 1 hour. In this case, changes in thicknesses of the polishing pads were measured while polishing pads being conditioned for 1 hour. An equipment used for conditioning was AP-300HM available from CTS Corp., a conditioning pressure was 6 lbf, a rotation speed was 100 to 110 rpm, and a disk used for conditioning was Saesol CI-45.

(3) Defect Measurement Method

Polishing was performed in the same manner as a polishing rate measuring method of (1), and after the polishing, the silicon wafer was moved to a cleaner, and cleaned using 1% HF, purified water (DIW), 1% $H_2NO_3$, and purified water (DIW) for 10 seconds. Thereafter, the silicon wafer was moved to a spin dryer, cleaned with purified water (DIW), and dried with nitrogen for 15 seconds. Changes in defects before and after the polishing in the dried silicon wafer were measured using a defect measuring equipment (manufacturer: Tenkor Corp., model name: XP+).

TABLE 9

|  | Example 1 | Example 2 | Comparative Example 1 | Comparative Example 2 |
|---|---|---|---|---|
| Ox RR (Å/min) | 2831 | 2794 | 2911 | 2811 |
| Cut-rate (µm/hr) | 19.5 | 19.8 | 18.9 | 18.5 |
| (Number of) Defects | 0 | 1 | 121 | 110 |

Table 9 represents measurement results of polishing performance for Examples 1 and 2 and Comparative Examples 1 and 2. According to the experimental results, it was confirmed that there was no difference in polishing rate and cut-rate in the polishing pads according to Examples and Comparative Examples, but defects did not almost appear in the polishing pads according to Examples while a large number of defects occurred in the polishing pads according to Comparative Examples as a result of confirming the number of defects.

TABLE 10

|  | Example 3 | Example 4 | Example 5 | Comparative Example 3 | Comparative Example 4 |
|---|---|---|---|---|---|
| Ox RR (Å/min) | 2735 | 3256 | 3689 | 7231 | 6897 |
| Cut-rate (µm/hr) | 19.2 | 20.1 | 19.5 | 55.3 | 46.7 |
| (Number of) Defects | 4 | 2 | 3 | 75 | 68 |

Table 10 represents measurement results of polishing performance for Examples 3 to 5, Comparative Examples 3 and 4. According to the results, Comparative Examples showed high numerical values in polishing rates than Examples, but showed a large difference in the number of defects when measuring defects, and also showed high numeral values in cut-rates of the polishing layers.

Although embodiments of the present disclosure have been described in detail hereinabove, the scope of the present disclosure is not limited thereto, but may include several modifications and alterations made by those skilled in the art using a basic concept of the present disclosure as defined in the claims.

The invention claimed is:

1. A polishing pad, comprising a polishing layer, wherein the polishing layer includes a plurality of pores, and
   the pores have a value of 0.5 to 1 according to the following Equation 1 or 2,
   wherein the pores formed in the polishing layer have a D50 of 15 to 65 µm:

$$\frac{D10}{D50}$$  [Equation 1]

$$\frac{D50}{D90}$$  [Equation 2]

wherein
D10 is a diameter of pores in 10% cumulative volume distribution,
D50 is a diameter of pores on 50% cumulative volume distribution, and
D90 is a diameter of pores on 90% cumulative volume distribution.

2. The polishing pad of claim 1, wherein the pores have a standard deviation of 2 to 9 of measured values for D10 to D90.

3. The polishing pad of claim 1, wherein the polishing layer has a real contact area of 0.02 to 0.05 mm$^2$ with a semiconductor substrate.

4. The polishing pad of claim 1, wherein the pores have a value of 0.5 to 1.5 according to the following Equation 3:

$$\frac{(D90 - D50)}{(D50 - D10)} \quad \text{[Equation 3]}$$

wherein
D10 is a diameter of pores in 10% cumulative volume distribution,
D50 is a diameter of pores in 50% cumulative volume distribution, and
D90 is a diameter of pores in 90% cumulative volume distribution.

5. The polishing pad of claim 1, wherein the polishing layer includes a shell derived from an unexpanded solid-phase blowing agent.

6. The polishing pad of claim 5, wherein the shell is one or more selected from the group consisting of a vinylidene chloride-based copolymer, an acrylonitrile-based copolymer, a methacrylonitrile-based copolymer and an acryl-based copolymer.

7. A method of manufacturing a polishing pad, the method comprising:
i) preparing a prepolymer composition;
ii) preparing a composition for manufacturing a polishing layer, containing the prepolymer composition, a blowing agent and a curing agent; and
iii) curing the composition for manufacturing a polishing layer to prepare a polishing layer,
wherein the polishing layer includes a plurality of pores, and
the pores have a value of 0.5 to 1 according to the following Equation 1 or 2,
wherein the pores formed in the polishing layer have a D50 of 15 to 65 μm:

$$\frac{D10}{D50} \quad \text{[Equation 1]}$$

$$\frac{D50}{D90} \quad \text{[Equation 2]}$$

wherein
D10 is a diameter of pores in 10% cumulative volume distribution,
D50 is a diameter of pores on 50% cumulative volume distribution, and
D90 is a diameter of pores on 90% cumulative volume distribution.

8. The method of claim 7, wherein the pores have a value of 0.5 to 1.5 according to the following Equation 3:

$$\frac{(D90 - D50)}{(D50 - D10)} \quad \text{[Equation 3]}$$

wherein
D10 is a diameter of pores in 10% cumulative volume distribution,
D50 is a diameter of pores in 50% cumulative volume distribution, and
D90 is a diameter of pores in 90% cumulative volume distribution.

9. The method of claim 7, wherein the blowing agent includes an unexpanded solid-phase blowing agent.

10. The method of claim 9, wherein the unexpanded solid-phase blowing agent is expanded by the curing of the step iii) to form a plurality of pores with a uniform size.

11. The method of claim 7, wherein the polishing layer includes a shell derived from an unexpanded solid-phase blowing agent.

12. The method of claim 7, wherein
in step iii), the composition for manufacturing a polishing layer is injected into a preheated mold and cured, and
the preheating temperature of the mold is 50 to 150° C.

13. The method of claim 7, wherein the pores have a standard deviation of 2 to 9 of measured values for D10 to D90.

14. A method of manufacturing a semiconductor device, the method comprising:
1) Providing a polishing pad including a polishing layer; and
2) Polishing the semiconductor substrate while rotating the semiconductor substrate and the polishing layer relative to each other so that a polished surface of the semiconductor substrate is in contact with the polishing surface of the polishing layer,
wherein the polishing layer includes a plurality of pores, and
the pores have a value of 0.5 to 1 according to the following Equation 1 or 2,
wherein the pores formed in the polishing layer have a D50 of 15 to 65 μm:

$$\frac{D10}{D50} \quad \text{[Equation 1]}$$

$$\frac{D50}{D90} \quad \text{[Equation 2]}$$

wherein
D10 is a diameter of pores in 10% cumulative volume distribution,
D50 is a diameter of pores on 50% cumulative volume distribution, and
D90 is a diameter of pores on 90% cumulative volume distribution.

15. The method of claim 14, wherein the pores have a value of 0.5 to 1.5 according to the following Equation 3:

$$\frac{(D90 - D50)}{(D50 - D10)} \quad \text{[Equation 3]}$$

wherein
D10 is a diameter of pores in 10% cumulative volume distribution,

D50 is a diameter of pores in 50% cumulative volume distribution, and

D90 is a diameter of pores in 90% cumulative volume distribution.

16. The method of claim 14, wherein the polishing layer has a real contact area of 0.02 to 0.05 mm² with a semiconductor substrate.

17. The method of claim 14, wherein the pores have a standard deviation of 2 to 9 of measured values for D10 to D90.

* * * * *